(12) United States Patent
Bann

(10) Patent No.: US 7,964,820 B2
(45) Date of Patent: Jun. 21, 2011

(54) PROCESS FOR LASER SCRIBING

(75) Inventor: Robert Bann, Banbury (GB)

(73) Assignee: Oerlikon Solar AG, Truebbach, Truebbach (CH)

( * ) Notice: Subject to any disclaimer, the term of this patent is extended or adjusted under 35 U.S.C. 154(b) by 540 days.

(21) Appl. No.: 12/015,145

(22) Filed: Jan. 16, 2008

(65) Prior Publication Data
US 2009/0188543 A1    Jul. 30, 2009

Related U.S. Application Data

(63) Continuation of application No. 11/762,910, filed on Jun. 14, 2007, now abandoned.

(30) Foreign Application Priority Data

Jun. 14, 2006    (GB) .................................. 0611738.6

(51) Int. Cl.
*B23K 26/38* (2006.01)

(52) U.S. Cl. ............ 219/121.69; 219/121.8; 219/121.81

(58) Field of Classification Search ............. 219/121.69, 219/121.72, 121.8, 121.67, 121.68, 121.78, 219/121.79, 121.81; 359/201.1, 201.2, 202.1
See application file for complete search history.

(56) References Cited

U.S. PATENT DOCUMENTS

| | | | |
|---|---|---|---|
| 5,373,137 A | | 12/1994 | McLaughlin |
| 6,072,149 A | * | 6/2000 | Maruyama et al. ......... 219/121.8 |
| 6,087,625 A | * | 7/2000 | Iso ............................... 219/121.8 |
| 6,300,593 B1 | * | 10/2001 | Powell ...................... 219/121.69 |
| 6,403,920 B1 | * | 6/2002 | Muneyuki et al. ........ 219/121.77 |
| 6,455,347 B1 | * | 9/2002 | Hiraishi et al. .................. 438/80 |
| 7,259,321 B2 | * | 8/2007 | Oswald et al. ................. 136/244 |
| 2003/0044539 A1 | * | 3/2003 | Oswald .......................... 427/404 |
| 2003/0180983 A1 | | 9/2003 | Oswald et al. |
| 2003/0209527 A1 | | 11/2003 | Borgeson et al. |
| 2005/0016972 A1 | * | 1/2005 | Borgeson et al. ........ 219/121.82 |
| 2005/0109747 A1 | * | 5/2005 | Alexander ............... 219/121.85 |
| 2007/0119831 A1 | * | 5/2007 | Kandt ...................... 219/121.82 |

FOREIGN PATENT DOCUMENTS

| | | |
|---|---|---|
| EP | 0 213 546 B1 | 1/1991 |
| EP | 1 061 589 A2 | 12/2000 |
| JP | 9-192868 A * | 7/1997 |
| JP | 10-209475 | 7/1998 |
| JP | 11-298017 A * | 10/1999 |
| JP | 2001-135836 A * | 5/2001 |
| JP | 2004-111946 A * | 4/2004 |
| JP | 2001-241421 A | 8/2004 |
| JP | 2006-41322 A * | 2/2006 |
| WO | 01/41967 A1 | 6/2001 |

* cited by examiner

*Primary Examiner* — Geoffrey S Evans
(74) *Attorney, Agent, or Firm* — Davis & Bujold, P.L.L.C.

(57) ABSTRACT

A method for accurately laser scribing lines on a panel utilising a laser beam scanner unit (13) including an optical system and a scanner lens. The unit (13) moves a laser beam (12) in a first direction (X), to scribe sections of lines (15) on the panel (11) that are a fraction of the total line length required and then moving the unit (13) continuously with respect to the panel (11) in a second direction (Y), perpendicular to the first direction (X), to form a band (16) of scribe lines. The scanner unit (13) is positioned so that the starting position of scribe lines in each band next to be processed overlap exactly the finishing position ends of scribe lines in the last band that has been processed so that all scribe lines interconnect. The method repeats the using and moving steps to form a plurality of parallel bands of scribe lines which cover the area of the panel.

7 Claims, 4 Drawing Sheets

PROCESS FOR LASER SCRIBING

This application is a continuation of U.S. application Ser. No. 11/762,910 filed Jun. 14, 2007 and claims priority from British Application Serial No. 0611738.6 filed Jun. 14, 2006.

FIELD OF THE INVENTION

This invention relates to a method for making multiple parallel laser scribes that are used to divide up large thin film solar panels and is based on creating parallel overlapping bands of small sections of the lines to be scribed by the use of scanner units. Such a method allows the scribes to be created quickly and accurately without high speed motion of the panel and permits a measurement system to be used that allows the position of secondary scribed lines to be placed very accurately with respect to previously scribed lines and permits compensation for irregularities in position caused by distortion of the panel.

BACKGROUND OF THE INVENTION

The use of lasers for scribing the thin layers found in solar panels to create and interconnect sub cells been well known for many years. The technology consists of laying down a thin layer of the lower electrode, often ITO, on a glass plate and laser scribing lines at typically 5-10 mm intervals to separate the ITO layer into electrically isolated regions. The electricity generating layer such as amorphous silicon is then applied over the whole area and a laser is used again to scribe lines in this layer parallel to and as close as possible to the initial scribes in the first layer. A third, top layer, often aluminium, is then applied and a laser beam is used for the third time to scribe lines in this layer as close to and parallel to the other lines to break the electrical continuity.

By this method an electrical series connection is made between all the cells in the panel so that the voltage generated by the whole panel is given by the product of the potential formed within each cell and the number of cells. Typically panels are divided up into 50-100 cells so that overall panel output voltages are in the 50 volt range. JP10209475 gives a thorough description of the standard laser processes used.

As well as ITO/Silicon/Aluminium structures many other materials can be used to make solar panels. Other equally effective devices are made based on Cadmium Telluride (CdTe), Copper-Indium-diselenide (CIS) and crystalline silicon on glass (CSG). In all cases lasers are used to scribe some or all of the layers involved.

The laser beams that are used to scribe individual layers are sometimes applied from the coated side of the glass sheet but can also be applied from the opposite side in which case the beams pass through the glass before interacting with the film. The lasers used generally operate in the infra-red (IR) region of the spectrum but lasers operating at the $2^{nd}$ harmonic wavelength (532 mm) are also widely used. Even UV lasers are sometimes used. The lasers are generally pulsed with pulse lengths in the range of a few to several 100 nanoseconds and operate at pulse repetition rates in the range of a few kHz to few MHz.

In some cases solar panels are made on non-transparent substrates such as metal sheets. In this case irradiation through the substrate is not possible so all scribing processes require beams incident from the coated side. In some other cases solar panels are fabricated on flexible substrates such as thin metal or polymer sheets. In the former case irradiation from only the coated side is possible. In the latter case irradiation from the coated side or through the substrate are both possible.

The common characteristics of all these devices is that multiple scribes each up to one or more metres in length have to be created in order to divide up each layer on a panel. Hence total scribe lengths per layer up to well over 100 m often need to be made by solar panel process tools in acceptable panel process times. These are generally less than 2 minutes. This means that laser scribing rates up to many metres per second are required.

Laser tools have already been built to achieve this. In some cases the tools have stationary optics which means the panel has to be moved very rapidly. To avoid excessive panel speed multiple stationary parallel optics heads are often used. As an example of this a panel with dimension of about 1.1×1.1 m requiring 160 separate scribes can be processed with 8 parallel beams in under 100 seconds with the panel moving at a maximum speed of less than 300 mm/sec. Such an approach is acceptable but complex in terms of the number of optics heads and laser beam splitting and balancing requirements. Having large heavy stage systems moving repetitively backwards and forwards at high speed also leads to unreliability.

Another approach has been to use a single beam to scribe all the lines but cause the beam to move at high speed using a galvanometer driven mirror scanner system. U.S. patent Application Publication No. US2003/0209527A1 describes such a case. A scanner system is used to move the laser beam across the full width of a 600 mm wide panel at speeds up to 4 metres/sec while the panel is moved in the orthogonal direction past the scanner unit.

This invention is effective in that no high speed panel motion is required and that only one beam is used but has the problem that to cover the full width of the panel a scanner lens with a large scan field has to be used. This usually means that the lens has a relatively long focal length. It is also often necessary to use a scanner system with a $3^{rd}$ axis to dynamically adjust the beam expansion during each scan in order to maintain focus over the full panel width. This adds complexity to the control system. The long focal length of the scan lens required leads to limitations to the minimum size of the focal spot that can be created and hence the scribe width that can be made is not as narrow as desired. It also leads to difficulties placing the scribes accurately as the positioning errors associated with scanner systems scale with the lens focal length. Both of these are major problems as ideal scribes should be as narrow in width as possible and successive scribes should be as close together as possible as the area between the three scribes does not generate electricity and therefore needs to be minimised.

US2003/0209527A1 also introduces the concept of continuous motion of the panel during scribing leading to what is termed a 'bow tie configuration'. Such a method is effective compared to step and scan processing and can be used readily where the position of the scribes is not critical. However, in the secondary and tertiary panel scribing processes where scribes need to be made very close to previous scribes, the bow tie configuration is difficult to implement.

In the situation where scribes need to be placed reliably very close to existing scribes because of panel distortions and size changes during manufacture it is necessary to measure the position of previous scribes and compensate by adjusting the scanner motion to maintain accurate relative positioning. A global measurement of overall panel expansion or shrinkage is readily made by measuring the position of the first and last scribes on a panel after loading. This data can be used to correct for these global changes by adjusting the parameters that control the panel motion through the tool or even correct for minor tilt to the lines. However, simple global distortion correction is not sufficient to allow close and accurate placement of scribes since scribe pitch can become irregular due to errors on the tool that make the first scribe or errors introduced during subsequent panel processing.

The invention described here uses a bow-tie configuration of the type described in US2003/0209527A1 but implements it in a way that seeks to overcome all the limitations described and allows a dynamic alignment system to be used that ensures that all scribes are accurately placed with respect to previous scribes. We call our scanning method 'bow tie scanning' ('BTS') and our alignment system 'dynamic scribe alignment' ('DSA')

SUMMARY OF THE INVENTION

According to the present invention there is provided a method for accurately laser scribing lines in thin coatings on a panel, typically a solar panel (11), utilising a laser beam scanner unit (13) including an optical system and a scanner lens characterised by the steps of:

using the unit (13) to move a laser beam (12) in a first direction (X) to scribe sections of lines (15) on the panel (11) that are a fraction of the total line length required;

moving the unit (13) continuously with respect to the panel (11) in a second direction (Y) perpendicular to the first direction (X) to form a band (16) of scribe lines;

positioning the scanner unit (13) so that the starting position of scribe lines in each band next to be processed overlap exactly the finishing position ends of scribe lines in the last band that has been processed so that all scribe lines interconnect; and repeating the using and moving steps to form a plurality of parallel bands of scribe lines to cover the full area of the panel with continuous scribe lines.

According to a first preferred version of the present invention the method is further characterised by a step of providing for the optical system and scanner lens (13) to focus the laser beam (12) on the surface of panel (11).

According to a second preferred version of the present invention or of the first preferred version thereof the method is further characterised by the step of providing for the optical system and scanner lens (13) to cause the laser beam (12) to be shaped, homogenised and imaged onto the surface of the panel (11).

According to a third preferred version of the present invention or of the first or second preferred versions thereof the method is further characterised by the use of more than one scanner unit (23, 23', FIG. 2), the units (23, 23') being used in parallel.

According to a fourth version of the present invention or of any preceding preferred version thereof the method is further characterised by being carried out in a vacuum chamber.

According to a fifth version of the present invention or of any preceding preferred version thereof the method is further characterised by the step of providing a single detector (45') attached to the scanner (42) so that during a secondary scribing operations following a primary scribing operation the detector (45) serves to detect the position of previously scribed lines (43) on existing layers in an area of the panel (41) adjacent to the band being processed in order to permit accurate placement of the secondary scribing operation relative to the primary scribing operation According to a sixth version of the present invention or of any preceding preferred version thereof the method is further characterised by the step of providing at least two detectors (45, 45') attached to each scanner (42) so that during a secondary scribing operation the detectors (45, 45') function to detect the position of the ends of previously scribed lines on existing layers in an area of the panel (41) adjacent to the band being processed in order to permit accurate placement of the secondary scribes with respect to the primary ones in both angle and position.

According to a second aspect of the present invention there is provided a product fabricated by way of a method according to any preceding claim.

In the present invention a scanner unit is used to move the beam at high speed (for example as disclosed in US2003/0209527A1) but the length of the beam scan region generated by the scanner unit is limited to a fraction of the total line length required rather than the full line length. The consequence of this is that multiple bands are needed to scribe the full lengths of the lines. This means that as well as the beam motion by the scanner unit motion of the substrate in two axes with respect of the scanner unit is required in order to cover the full area.

As an example consider the case where a panel with dimensions 600×1200 mm is required to be scribed with about 120 lines on a pitch of about 10 mm all parallel to the short edge of the panel. The panel is processed with a single scanner and fed by a single laser. The length of the line scribed by the scanner is limited to a fifth of the panel width so the scan length is 120 mm and 5 bands are needed to cover the full panel area. The process consists of continuous movement of the panel relative to the scan head in the direction perpendicular to the scribe line direction while BTS scanning is carried out to scribe lines over a band with width of 120 mm. After movement of the panel over the full length of 1200 mm the panel or scanner is stepped in the direction parallel to the line direction by the width of the band and the process is repeated. After five such passes the full area of the panel has been covered. Exact overlap of the ends of the scribed lines in one band with the adjacent band is of course essential to have continuous scribes.

The key advantage of the arrangement described in this invention is that by limiting the scan length to a fraction of the scribe length it is possible to use scan lenses with relatively short focal length (typically 200 mm or less) and hence smaller spot sizes and high accuracy spot positioning are readily achievable. The use of 3 axis scanners is also unnecessary.

Another major advantage of this invention is that it is readily scalable to much larger panel sizes. This is not possible in the type of process described in US2003/0209527A1 as accurate control of spot size and position with field sizes up to 1 m or more is very difficult.

A further key advantage of this method for scribing solar panels is that by the use of scan lenses with short focal length it is possible to use such lenses in imaging rather than focus mode, so allowing their use with homogenized and shaped laser beams.

As an example of how this scanner based scribing technique can be scaled up to process larger panels consider the case of a solar panel with dimensions of 2.0×1.6 m where 100 scribes parallel to the long edge are required. In this case four scanner units are used. Each scan head may be fed by its own laser or, depending on the process, may use a fraction of the beam from a laser.

The four scanners are mounted on a moving carriage on a gantry above the panel and the scanners are spaced at one quarter of the panel width, in this case 400 mm. The panel is mounted on a single axis stage so it can be moved in the orthogonal direction to the gantry. The process proceeds as follows:

The panel moves such that the scanners are situated above the leading edge of the panel.

The scanner carriage moves on the gantry such that one scanner is situated close to the side edge of the panel.

All four scanners operate in BTS mode with the scanner carriage moving continuously in a direction parallel to the leading edge of the panel scribing a series of lines parallel to the long side edges of the panel in a band 100 mm wide.

The scanner carriage moves over a distance equal to the spacing between scanners in this case 400 mm, so that at the leading edge of the panel the whole length of the band has been scribed.

The panel is then indexed forward by 100 mm and the processes above repeated generating a second band of scribe lines adjacent to the first with the ends of the lines in one band coinciding exactly with the ends in the next band.

The process is repeated 20 times so that 20 bands are created and the whole panel surface is covered with continuous scribe lines.

If the scribes are required to be made in the direction parallel to the short edge of the panel then the same optical arrangement can be used as follows—

The panel moves such that the row of scanners is situated above the leading edge of the panel.

The scanner carriage moves on the gantry such that one of the four scanners is close to the side edge of the panel.

All four scanners operate in BTS mode with the panel moving continuously in a direction parallel to the panel long edge, scribing a series of lines on a 10 mm pitch parallel to the panel short edge in a band 100 mm wide that runs parallel to panel side edge.

The panel moves over the full length of 2.0 m creating four bands of lines on the panel surface.

The carriage on the scanner gantry steps sideways by 100 mm and the process repeats with the panel moving in the reverse direction creating 4 more bands adjacent to the first set.

The process repeats two more times until a total of 16 bands have been created and the whole panel area has been covered.

In the above examples the use of four scan heads has only been taken to illustrate the process. Any number of scan heads from 1 to 8 or even more, are possible depending on the panel size and process time requirements. As more scan heads are added the total number of scanner passes or the total travel of each scanner over the panel reduces so reducing process time.

In the above examples the use of scan line lengths of 100 or 120 mm are only used to illustrate the process. Any scan line length, or width of band, is possible depending of process requirements. In general where high accuracy and high resolution mask imaging is used to create a shaped, sharp edged spot a short focal length lens is used and the scribe line length in each band is generally in the 50 to 100 mm range. In situations where a focussed spot can be used and scribe positioning accuracy requirements are not so high a longer focal length lens can be used and scribe line lengths of up to 200 mm or more are possible.

The critical requirement for this method of solar panel scribing to be effective is that the join region between bands must not cause damage to the substrate or limit the solar panel performance in any way. There must be a small overlap region where the end of one line just overlaps the adjacent corresponding line and hence process conditions must be such that the additional laser shots that this overlap area receives do not cause any problems for the effective operation of the panel.

For the thin films used in glass based solar panel manufacture it is usually the case that the laser beams interact with the film and cause it to be ablated after 1 or 2 laser shots and that additional shots cause no further effect as the beam passes through the glass. This applies usually whatever layer is ablated if the correct laser wave length and energy density are chosen.

In the examples given above the laser beam or beams are incident from above on to the upper, coated, side of the panel. This is not an exclusive arrangement and other arrangements are equally possible. The beams may be incident from above and the panel may be arranged with the coated side facing downwards. Alternatively the scanner units may be positioned below the panel with the beams directed upwards with the panel having its upper or lower surface coated.

In all the examples given above the panel has been arranged to move in one axis while the carriage carrying the scanners moves in the orthogonal axis. Other arrangements are also possible. The panel can remain stationary during processing with the scanners moving in 2 axes by means of a moving gantry over the panel. Alternatively the scanners can be held stationary and the panel caused to move in 2 axes.

The arrangement where the panel moves in one direction while the scanners move in the other is very convenient if it is required to scribe lines on a panel that is retained within a vacuum chamber during transfer between coating units. In this case the panel is moved horizontally in one axis within the chamber while the scanner units move in the orthogonal direction on a gantry over the chamber with the laser beams directed downwards through a window onto the surface of the panel. The coated side of the panel may face up or down in this arrangement. This arrangement could even allow the scribing of lines on panels that are at elevated temperature.

Mounting the panel horizontally is not an exclusive arrangement. The present invention can operate with the panel held vertically or even at some angle to the vertical. In this case movement of the panel in the horizontal direction and movement of the scanners in the vertical direction is a practical arrangement. This arrangement is particularly appropriate if it is required to scribe lines on a panel that is retained within a vacuum chamber during transfer between coating units that operate with the panels oriented in the vertical, or close to vertical, plane.

One of the major problems that occurs during the scribing of solar panels is the accurate control of scribe position on the surface of the panel. Most solar panel manufacturing arrangements require three separate sequential laser scribing operations. The positioning accuracy requirements for the scribes in the first layer are much less critical compared to the second and third layer scribes which have to be placed very accurately with respect to the previous scribes. One key advantage of the invention described here where short lengths of scribe lines are created in a series of relatively narrow bands is that an alignment scheme can be readily implemented to measure the position on the panel of existing scribes that are adjacent to the band being scribed. The data gathered is stored and used to correct the scanner trajectory when the measured band is subsequently scribed. In this way the system is continuously measuring the exact position of the previously scribed lines in the next band to be scribed while accurate placement of secondary scribes with respect to primary scribes in each band is being performed. We call this alignment technique "dynamic scribe alignment" (DSA).

Dynamic scribe alignment (DSA) is implemented in its simplest form by attaching a suitable detector to each scan head. The detector is offset from the beam centre in the direction parallel to the scribe lines by a distance that places it within the width of the adjacent scribe line band. In this position, as the scanner is moved over the surface of the panel or the panel is moved below the scanner, the detector records the position of the scribed lines in the band of lines that will next be processed. When the detector records the presence of a scribed line the encoder position on the gantry or panel stage is recorded as a reference for the scribe line position. This is repeated for all scribe lines in the band. After a complete band has been scribed so that the complete set of data about the position of all scribe lines in the adjacent band has been recorded the data is processed and downloaded to the scanner controller. This data download operation can take place during the time the panel or scanner is moved from the position above the band that has just been laser scribed to the position above the adjacent band that has just been measured. The recorded and processed scribe position data is then used to correct the scanner motion so that the trajectories of the lines scanned are corrected for minor displacements of the previously scribed lines and consequently the spacing between each new line and each previously scribed line can be accurately maintained.

To allow scribing of lines parallel to either edge of the panel each scanner head needs to have 2 detectors attached to it. The detectors are mounted at 90 degrees to each other with offset directions from the scanner beam centre line parallel to both stage axes. The offset distances from the scanner beam centre line are such as to place the detectors over the adjacent bands in each case.

This method of "dynamic scribe alignment" (DSA) is very effective as it allows local variations in scribe positions for all lines to be measured and compensated for without significantly slowing the overall scribing process. DSA achieves this as recording of the position of all the sections of scribe lines that already exist in a lower layer film on the panel occurs in one band at the same time as secondary lines are being accurately positioned and scribed in an upper layer in an adjacent band so no significant time is added to the scribing process. The only extra time required is that used to measure the first band of lines. In this case it is not possible to scribe lines at the same time so this adds time to the overall process. However, since this alignment pass along the first band can be accomplished at the maximum stage speed permitted, which is significantly faster than the speed used while scribing lines and since there are multiple bands to be scribed, adding one additional pass for gathering the data associated with the line positions in the first band adds a minor amount to the overall time.

The use of a single scribe line position detector for DSA only permits the accurate alignment and positioning of each subsequent scribe line to a single position on each earlier scribe line. The DSA technique can be considerably improved if two detectors are used on each scan head with both displaced along a line parallel to the scribe line direction and positioned so that one detector records close to one end of the scribe line in the adjacent band and the other detector records close to the opposite end. This means that one detector is displaced about half the scribe line band width from the scanner beam centre position and the separation between detectors is close to the full band width. In this way the two detectors record positions close to the two ends of each scribe line so can be used to detect both the spatial and angular variations of the scribe line sections. By attaching another set of two detectors to the scanner head, arranged at 90 degrees to the first set, the position of the ends of lines in both directions on the panel can be detected and position and angle errors compensated for when the next set of scribes are made.

A variety of optical based sensors can be used as DSA detectors. The requirement in each case is to detect the location of a line cut in one thin film when overlaid with another. This means that the optical transmission properties of the film at the scribe position usually changes significantly so changes in the optical transmission can be readily measured.

BRIEF DESCRIPTION OF DRAWINGS

Exemplary embodiments of the invention will now be described with reference to the accompanying drawings of which.

DETAILED DESCRIPTION OF THE INVENTION

Figure 1:
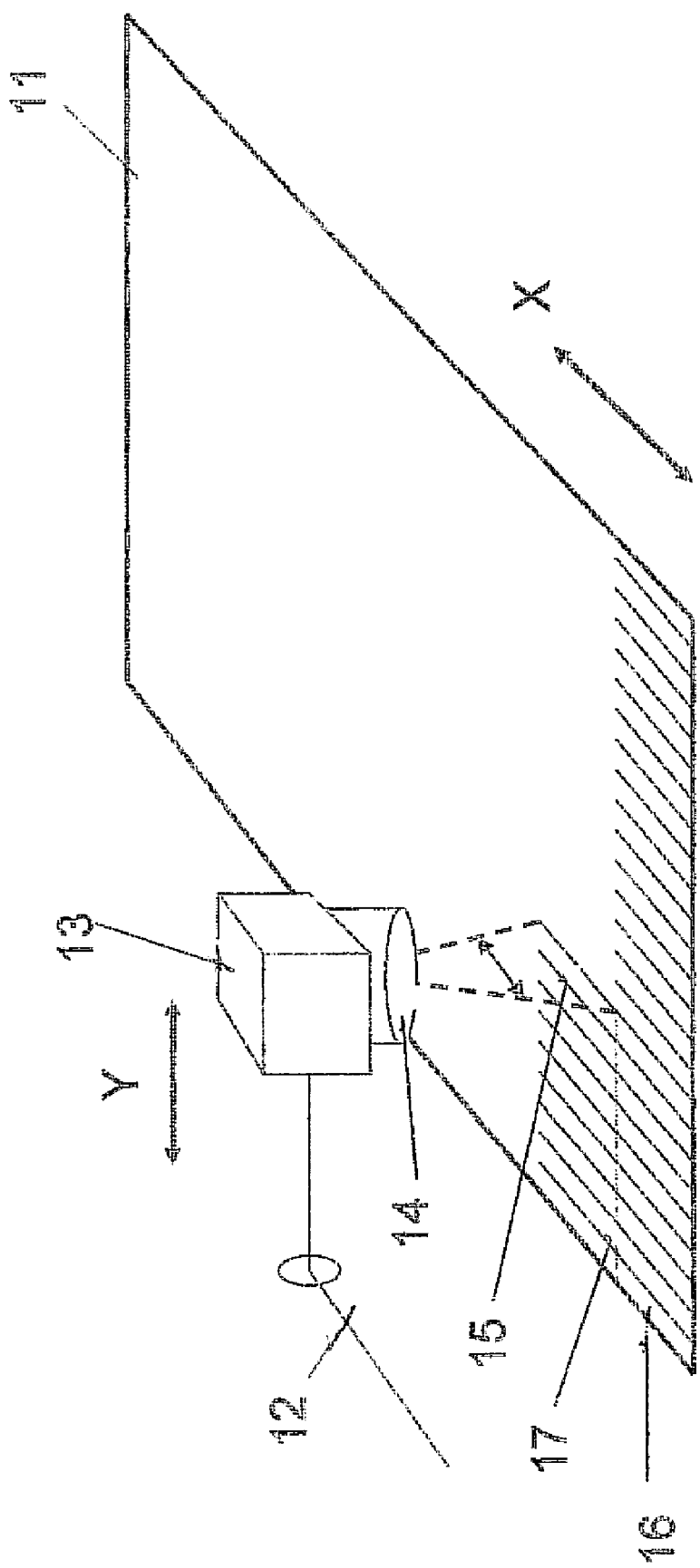
FIG. 1 shows a generalized diagram of an arrangement suitable for scribing solar panels by the methods described in this invention where a single scanner unit scribes lines parallel to the longer side of a rectangular panel.

FIG. 1 shows how a large flat solar panel 11 consisting of glass, metal or polymer substrate coated with an ITO or other conducting or semi-conducting layer or combination of layers is mounted on a stage system that allows it to move in one axis X. The requirement is to scribe multiple parallel lines in the coating running parallel to the long side of the rectangular panel in the X direction. The beam 12 from a laser is passed through a two-axis scanner unit 13 and is focussed by a lens 14 onto the surface of the panel in order to scribe lines 15 on the panel. The scanner unit is mounted on a moving carriage on a gantry over the panel so that it can move in the direction Y. Rows of scribe lines in the coating, running parallel to the X axis, are created in a series of bands 16 as shown, where the width of each band is a fraction of the total length of the panel. Each band is created by continuous movement of the scanner in the Y direction while the scanner unit is deflecting the beam over the width of the band in the X direction. This type of processing is termed bow-tie scanning (BTS). After the scanner has moved over the full panel width in Y the panel is stepped in X by the width of the band 16 and the process is repeated with the scanner moving in the reverse Y direction. The whole panel area is scribed with multiple parallel bands that overlap sufficiently at the boundary between bands 17 in order to make continuous scribes over the full length of the panel.

Figure 2:
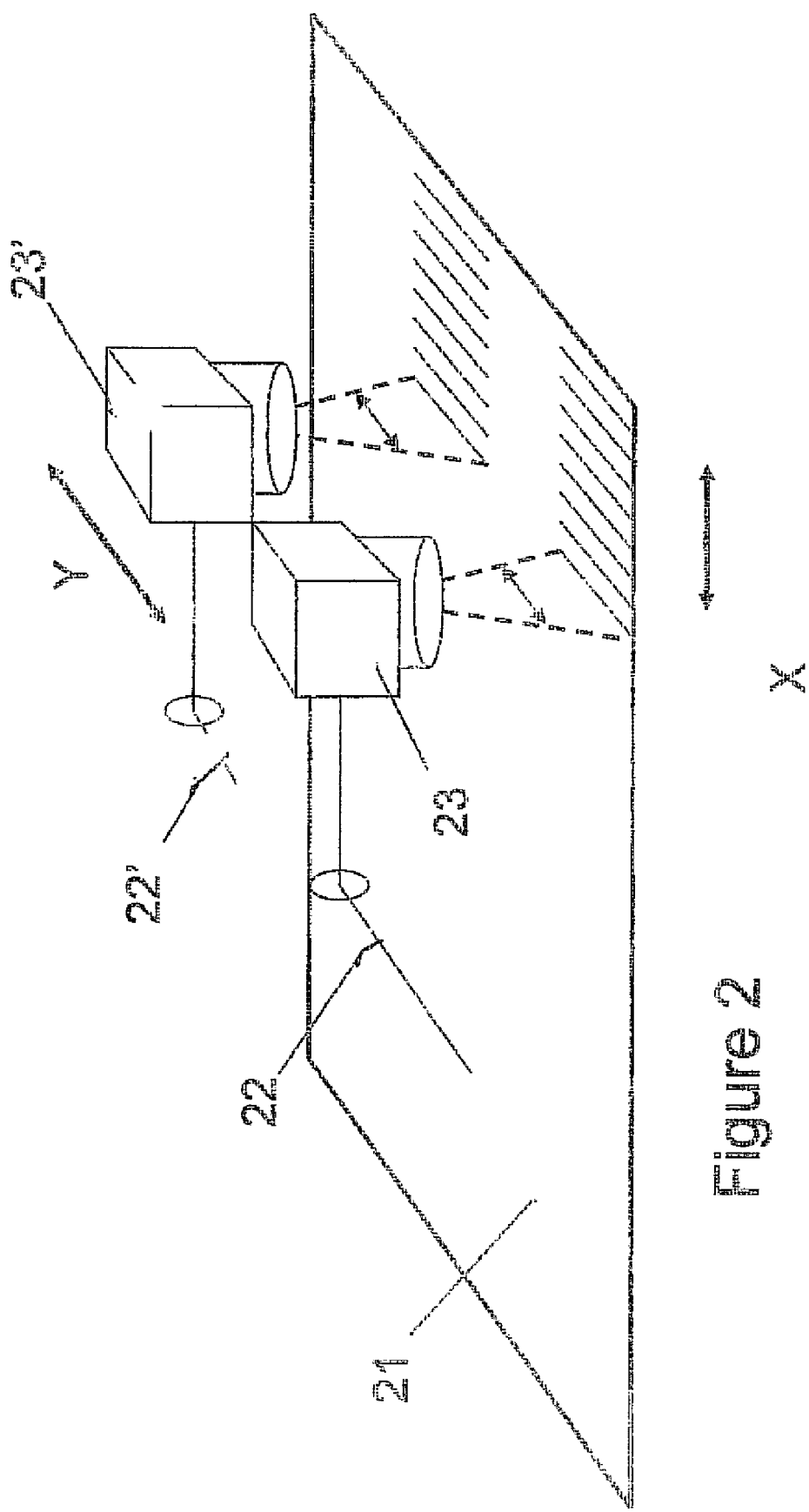
FIG. 2 shows a generalized diagram of an arrangement suitable for scribing solar panels by the methods described in this invention where two scanner units operate in parallel to scribe lines parallel to the shorter side of a rectangular panel.

FIG. 2 This shows a more complex arrangement than that of FIG. 1 to meet a requirement to scribe lines in a solar panel coating that run parallel to the short edge of the rectangular panel. The panel 21 is mounted on a stage that allows it to move in the X direction. Two laser beams 22, 22' are directed to two scanner units 23, 23' that are separated in the Y direction by half the width of the panel. The scanner units are mounted on a carriage on a gantry over the panel that allows then to move in the Y direction. The full area of the panel is scribed in a series of bands running parallel to the long axis by moving the panel continuously in the X direction and per-forming BTS scribing operations with both scanner heads at the same time. After the full length of the panel has been covered the scanners step in the Y direction by the width of the band and the process is repeated. In the particular case shown in FIG. 2 only two passes of the panel are required to complete the scribing operation but in practice a larger number of passes are more likely.

Figure 3:
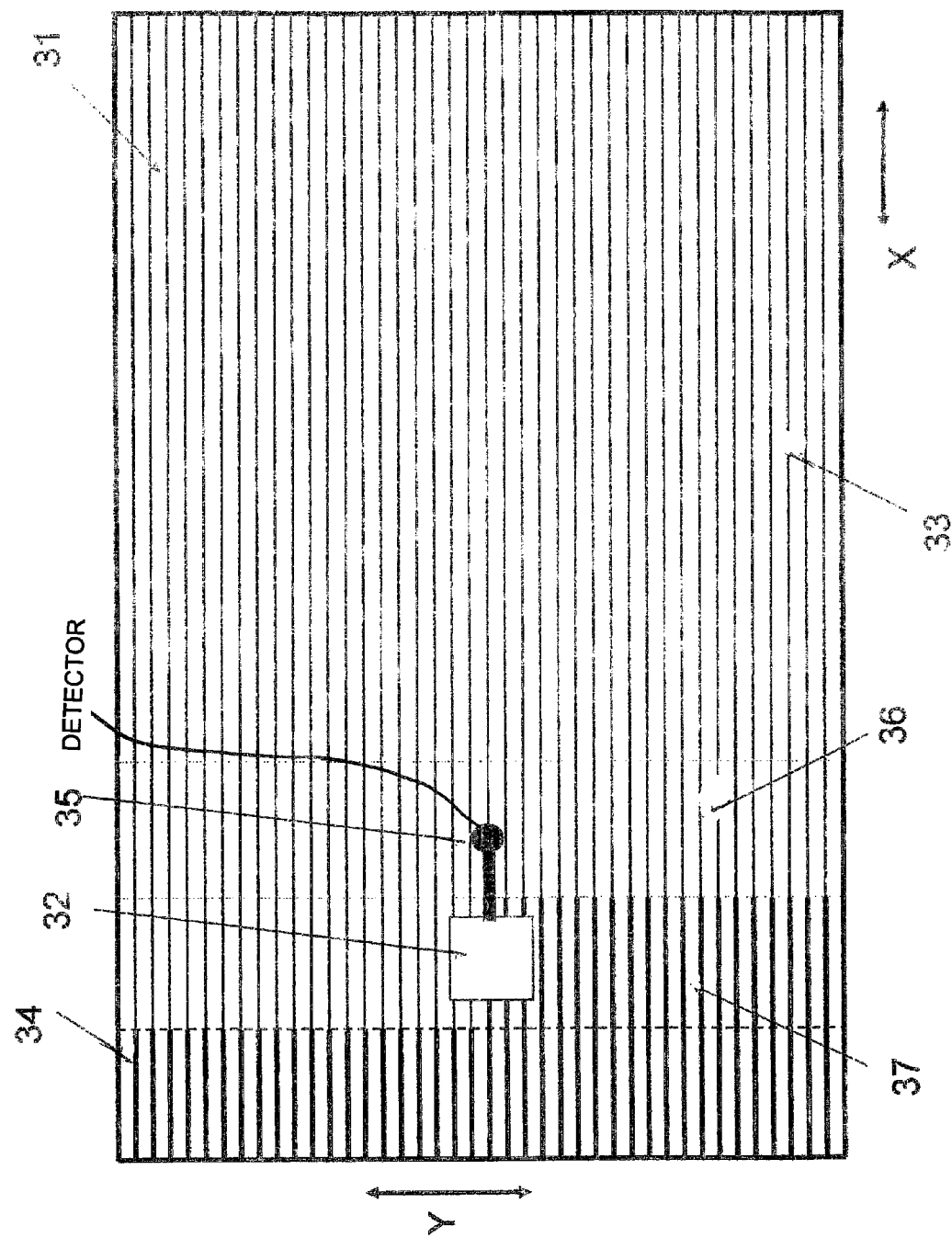
FIG. 3 shows a plan of a solar panel scribing tool arrangement with a single scanner unit with a detector attached for dynamic scribe alignment of a new set of scribe lines to existing scribe line positions.

FIG. 3 This shows a top view of an arrangement similar to that shown in FIG. 1 where a solar panel 31 can travel in the X direction and a scanner unit 32 can travel over the panel in the Y direction. The solar panel has one or more film layers already applied that have previously been laser scribed 33 and the panel has then been over coated with an additional layer and the requirement is to scribe a further set of new lines 34 in the top coating parallel to and very close to the existing lines. In this case a detector device 35 is mounted to the scanner unit as shown. The detector is facing downwards and is used in conjunction with the encoder in the Y axis stage to detect and record the position of existing scribe lines 33 on the panel. The detector is displaced in the X direction from the scanner beam center position such that it views the surface of the panel at a point within the adjacent band 36 to that presently being processed 37. In the figure shown the detector is separated from the beam line center by a distance approximately equal to the scribe band width 36 which means the detector records line position data corresponding to the center of the adjacent band. The detector can be mounted in other positions displaced in both X and Y directions from the scanner beam centre position so long as it observes the surface of the panel at a point somewhere within the next band to be scribed. During BTS scribing operations in one band data on the existing scribe line positions in the adjacent band is collected and stored in a suitable computer. The panel is stepped in X so that the measured band is placed under the scanner, the processed scribe line position data is down loaded to the scanner controller and BTS line scribing operations are then performed on the measured band with the processed data used to correct the trajectory of the beam during scanning to compensate for deviations of the existing scribe lines from the expected positions.

FIG. 3 shows the particular case of a panel that is fully processed by means of 9 passes of the scanner over the panel giving rise to 9 bands of interconnecting scribe lines. The figure shows the process in the middle of the second pass. The scanner is moving in the Y direction towards the top of the figure and the scanner is scribing secondary scribe sections in the band below it while the detector on the head is detecting the position of previous layer scribe line sections in the next band to be scribed.

Figure 4:
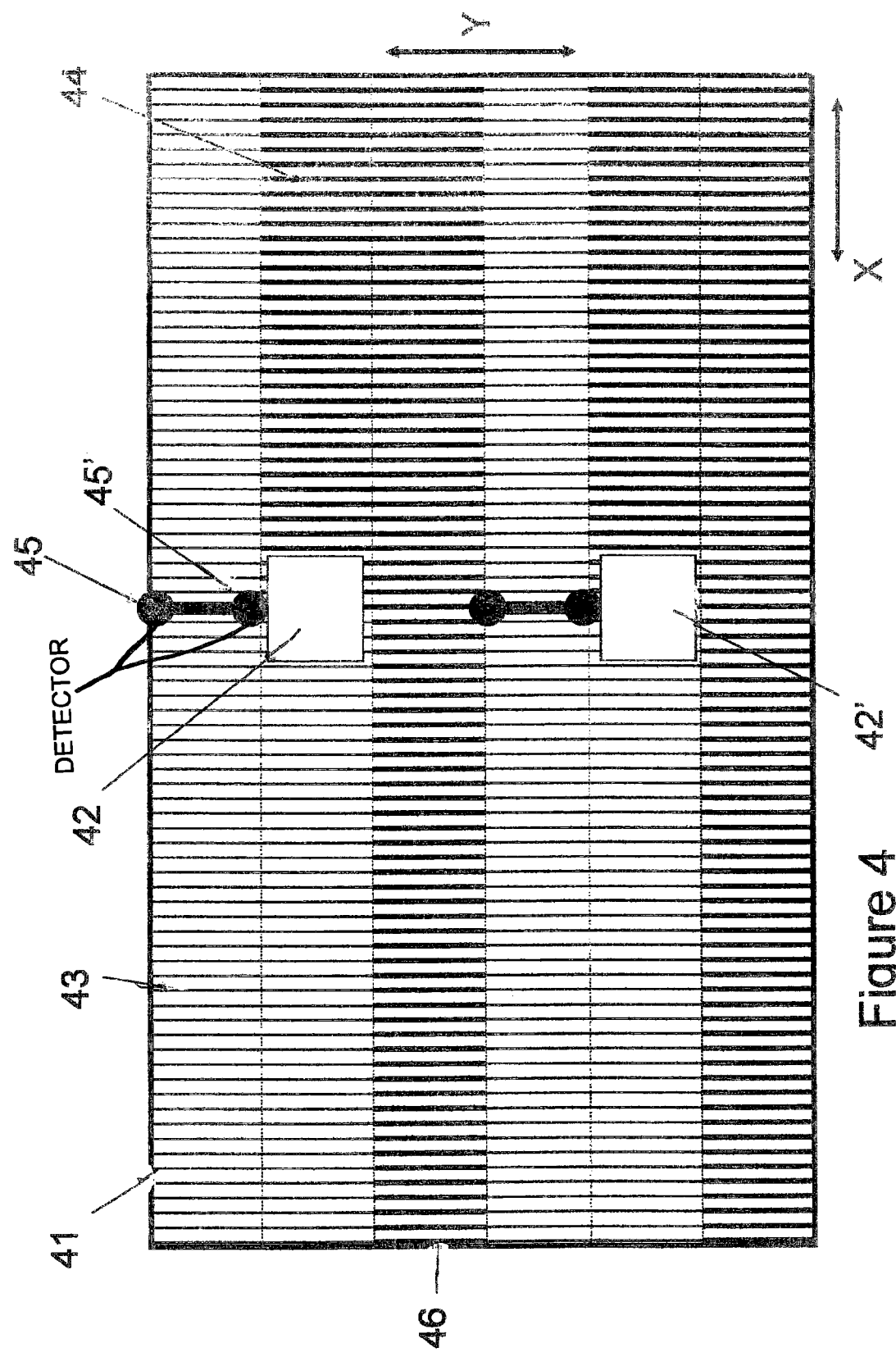
FIG. 4 shows a plan of a solar panel scribing tool arrangement with two scanners each with multiple detectors used for dynamic scribe alignment of a new set of scribe lines to existing scribe lines in both angle and position.

FIG. 4 shows a top view of an arrangement similar to that shown in FIG. 2 where a solar panel 41 can travel in the X direction and two scanner units 42, 42' can travel over the panel in the Y direction. The solar panel 41 has one or more film layers already applied that have previously been laser scribed 43 and the panel 41 has then been over coated with an additional layer. The requirement is to scribe a further set of new lines 44 in the top coating parallel, and very close, to the existing lines. In this case two detector devices 45, 45' are attached to each scanner unit as shown. The detectors face downwards and are used in conjunction with the encoder in the X axis stage to detect and record the position of the existing scribe lines 43 on the panel. The detectors are displaced in the Y direction from the scanner beam centre position such that they view the surface of the panel at positions close to the ends of existing scribe line sections within the adjacent band to that presently being processed. In the figure shown the detectors are separated from the beam line centre by distances approximately equal to half the scribe band width and one and one half times the scribe band width 46 which means the detectors record line position data corresponding to the ends of the lines in the adjacent band. The detectors can be mounted in other positions with respect to the scanner unit so long as they observe the surface of the panel at points somewhere close to the ends of the scribe lines within the next band to be scribed. During secondary level BTS scribing operations in one band data on the positions of both ends of the existing scribe lines in the adjacent band is collected and stored in a suitable computer. The scanners are stepped in Y so that the measured bands are placed under the scanners, the processed scribe line end position data is down loaded to the scanner controllers and BTS line scribing operations are then performed on the measured bands with the processed data used to correct the trajectory of the beam during scanning to compensate spatially and angularly for deviations of the existing scribe lines from the expected location.

FIG. 4 This shows the particular case of a panel that is fully processed by means of three passes of the panel under the scanners giving rise to six bands of interconnecting scribe lines. The figure shows the process in the middle of the second pass. The panel is moving in the X direction towards the right of the figure and the two scan heads are scribing secondary scribe sections in the bands below them while the two detectors on each head are detecting the position and angle of previous layer scribe line sections in the next bands to be scribed.

The invention claimed is:

1. A method for accurately laser scribing lines in thin coatings on a panel, utilizing a laser beam scanner unit including an optical system and a scanner lens, the method comprising the steps of:
   a) using the scanner unit to move a laser beam in a first direction (X) to scribe sections of lines on the panel that are running parallel to the first direction (X) and that are a fraction of a total line length required;
   b) moving the scanner unit continuously with respect to the panel in a second direction (Y), perpendicular to the first direction (X), to form a band of scribe lines, the band having a width in the first direction (X); and
   c) repeating the using and the moving steps to form a plurality of parallel bands of scribe lines to cover the full area of the panel with continuous scribe lines in that the scanner unit is positioned so that the starting position of scribe lines in each band next to be processed overlap exactly finishing position ends of scribe lines in a last band that has been processed so that all scribe lines interconnect to rows of scribe lines which run parallel to the first direction (X), the rows forming the continuous scribe lines.

2. The method according to claim 1, further comprising the step of causing the laser beam to be at least one of shaped, homogenized and imaged onto the surface of the panel.

3. The method according to claim 1, further comprising the step of carrying out the method in a vacuum chamber.

4. The method according to claim 1, further comprising the step of focusing the laser beam on the surface of the panel.

5. The method according to claim 4, further comprising the step of utilizing a plurality of scanner units with each of the plurality of scanner units being utilized in parallel with one another.

6. A method for accurately laser scribing lines in thin coatings on a panel utilizing a laser beam scanner unit including an optical system and a scanner lens, the method comprising the steps of:

using the scanner unit to move a laser beam in a first direction (X) to scribe sections of lines on the panel that are a fraction of a total line length required;

moving the scanner unit continuously with respect to the panel in a second direction (Y), perpendicular to the first direction (X), to form a band of scribe lines;

positioning the scanner unit so that the starting position of scribe lines in each band next to be processed overlap exactly finishing position ends of scribe lines in a last band that has been processed so that all scribe lines interconnect;

repeating the using and moving steps to form a plurality of parallel bands of scribe lines to cover the full area of the panel with continuous scribe lines, and providing a single detector, attached to the scanner unit, so that during a secondary scribing operations, following a primary scribing operation, the detector serves to detect the position of previously scribed lines on existing layers in an area of the pane adjacent to the band being processed, in order to permit accurate placement of the secondary scribing operation relative to the primary scribing operation.

7. A method for accurately laser scribing lines in thin coatings on a panel utilizing a laser beam scanner unit including an optical system and a scanner lens, the method comprising the steps of:

using the scanner unit to move a laser beam in a first direction (X) to scribe sections of lines on the panel that are a fraction of a total line length required;

moving the scanner unit continuously with respect to the panel in a second direction (Y), perpendicular to the first direction (X), to form a band of scribe lines;

positioning the scanner unit so that the starting position of scribe lines in each band next to be processed overlap exactly finishing position ends of scribe lines in a last band that has been processed so that all scribe lines interconnect;

repeating the using and moving steps to form a plurality of parallel bands of scribe lines to cover the full area of the panel with continuous scribe lines, focusing the laser beam of the optical system and scanner lens on the surface of the panel, and providing at least two detectors attached to each scanner unit so that during a secondary scribing operation, the detectors function to detect the position of the ends of previously scribed lines, on existing layers in an area of the panel adjacent to the band being processed, in order to permit accurate placement of the secondary scribes with respect to the primary ones in both angle and position.

* * * * *